(12) United States Patent
Pond et al.

(10) Patent No.: US 11,635,616 B2
(45) Date of Patent: Apr. 25, 2023

(54) SYSTEM AND METHOD FOR CREATING A SINGLE PORT INTERFACE FOR SIMULATING BIDIRECTIONAL SIGNALS IN CIRCUITS USING AVAILABLE CIRCUIT SIMULATION STANDARDS

(71) Applicant: ANSYS Lumerical IP, LLC, Wilmington, DE (US)

(72) Inventors: James Frederick Pond, Vancouver (CA); Zeqin Lu, Vancouver (CA); Adam Robert Reid, Vancouver (CA); Vighen Pacradouni, Vancouver (CA); Jui Feng Chung, Vancouver (CA)

(73) Assignee: ANSYS LUMERICAL IP, LLC, Canonsburg, PA (US)

(*) Notice: Subject to any disclaimer, the term of this patent is extended or adjusted under 35 U.S.C. 154(b) by 344 days.

(21) Appl. No.: 16/913,490

(22) Filed: Jun. 26, 2020

(65) Prior Publication Data
US 2020/0326534 A1 Oct. 15, 2020

Related U.S. Application Data

(63) Continuation of application No. PCT/CA2019/051756, filed on Dec. 5, 2019.
(Continued)

(51) Int. Cl.
*G02B 27/00* (2006.01)
*G06F 30/20* (2020.01)
(Continued)

(52) U.S. Cl.
CPC ......... *G02B 27/0012* (2013.01); *G06F 30/20* (2020.01); *G06F 30/32* (2020.01); *H04B 10/50* (2013.01); *H04B 10/67* (2013.01)

(58) Field of Classification Search
CPC ..... G02B 27/0012; G06F 30/20; G06F 30/32; H04B 10/50; H04B 10/2589
See application file for complete search history.

(56) References Cited

U.S. PATENT DOCUMENTS 8,712,751 B2 4/2014 Chen
2010/0286807 A1 11/2010 Chen

OTHER PUBLICATIONS

Patel OptSim Circuit Synopsys Oct. 2017 (Year: 2017).*
(Continued)

*Primary Examiner* — Rehana Perveen
*Assistant Examiner* — Cuong V Luu
(74) *Attorney, Agent, or Firm* — Wen-Jeng Vincent Lue

(57) ABSTRACT

A system and method are provided for simulating circuits that transmit bidirectional signals between some ports using simulators designed originally for electrical circuits and systems, that eliminate the need for different port interfaces. The system and method can be applied to simulate photonic circuits either standalone or integrated with electrical circuits and systems. In one method implemented by the system potential and flow representations, available for example in Verilog-A simulators, are used to create bidirectional signals on a single bus line to transmit optical signals. In another method implemented by the system, the system auto-configures each optical port type as left or right at runtime or during a pre-simulation initialization to allow for bidirectional signals with a single port interface.

21 Claims, 12 Drawing Sheets

Related U.S. Application Data

(60) Provisional application No. 62/776,067, filed on Dec. 6, 2018.

(51) Int. Cl.
    *G06F 30/32*    (2020.01)
    *H04B 10/50*    (2013.01)
    *H04B 10/67*    (2013.01)

(56) References Cited

OTHER PUBLICATIONS

Morikawa Signal Representation George Mason University, May 2015 (Year: 2015).*
Zhang et al. Compact Modeling for Silicon Photonic Heterogeneously Integrated Circuits Journal of Lightwave Technology, vol. 35, No. 15, Jul. 2017 (Year: 2017).*
International Preliminary Report issued in corresponding PCT application No. PCT/CA2019/051756, dated Jun. 17, 2021, total 5 pages.
Martin, P. et al. "Modeling of Silicon Photonics Devices with Verilog-A", 2014 29th International Conference on Microelectronics (MIEL 2014); Belgrade, Serbia, p. 209-212, dated May 12-14, 2014, total 4 pages.
Sy, Gary; International Search Report from corresponding PCT Application No. PCT/CA2019/051756 ; search completed on Dec. 23, 2020, 3 pages.
P. Martin, F. Gays, E. Grellier, A. Myko and S. Menezo: "Modeling of Silicon Photonics Devices with Verilog-A", Proc. 29th International Conference on Microelectronics (Miel 2014), Belgrade, Sebia, May 12-14, 2014, p. 209 to p. 212, 4 pages.
Cheryl Sorace-Agaskar, Jonathan Leu, Michael R. Watts, and Vladimir Stojanovic: "Electro-optical co-simulation for Integrated CMOS photonic circuits with VerilogA", vol. 23, No. 21, DOI:10.1364/OE.23.027180, Optics Express 27180, Oct. 19, 2015, 24 pages.
Ekaterina Kononov, "Modeling Photonic Links in Verilog-A", Submitted to the Department of Electrical Engineering and Computer Science in partial fulfillment of the requirements for the degree of Master of Engineering in Computer Science and Engineering at the Massachusetts Institute of Technology, Jun. 2013, 60 pages.
Wikipedia, "Medium-dependent interface", retrieved from the Internet: Jun. 5, 2020, 4 pages, https://en.wikipedia.org/wiki/Medium-dependent_interface.
Intellectual Property Licensing: HP Auto-MDIX technology, retrieved from the Internet: Jun. 5, 2020, 1 page, www.hp.com/hpinfo/abouthp/iplicensing/automdix.html.

* cited by examiner

Potential (V) and flow (I)

Incoming (a) and outgoing (b) waves

US 11,635,616 B2

SYSTEM AND METHOD FOR CREATING A SINGLE PORT INTERFACE FOR SIMULATING BIDIRECTIONAL SIGNALS IN CIRCUITS USING AVAILABLE CIRCUIT SIMULATION STANDARDS

CROSS-REFERENCE TO RELATED APPLICATIONS

The present application is a continuation of PCT Application No. PCT/CA2019/051756 filed on Dec. 5, 2019, which claims priority from U.S. Provisional Application No. 62/776,067 filed on Dec. 6, 2018, both applications being incorporated herein by reference.

TECHNICAL FIELD

The following relates to systems and methods for creating a single port interface for simulating bidirectional signals in circuits using available circuit simulation standards, including circuits having photonic elements and photonic circuits.

BACKGROUND

It is well known that behavioural models for photonic components can be described using, for example, the Verilog-A modeling language (the continuous-time subset of Verilog-AMS). The standard approach is to represent optical connections using a bus that supports multiple analog signals. For example, in a system where the waveguides are single mode, two analog signals are required to represent the forward propagating envelope of an optical signal at a given carrier frequency. Two signals are necessary because the optical envelope is complex-valued and therefore the real and imaginary parts (or amplitude and phase) need to be transmitted. The envelope is complex valued because photonic simulation is generally done using an equivalent baseband signal centered at an optical carrier frequency. For bidirectional signals, two additional signals are used, to represent the backward propagating optical envelope. If the waveguides in the system support more than one mode, the number of analog signals need to be multiplied by the number of supported modes. Finally, some implementations transmit the optical carrier frequency as a signal which, in principle, allows for multiple channels to be simulated simultaneously, as long as enough analog signal lines are included in the bus. It has been noted that most implementations use analog signals, but it is possible to use other types of signals supported by many simulators, such as analog-like real-valued modeling (sometimes called wreal).

The multi-line bus requires a standard interface definition for element ports. This is necessary so that each behavioral model implemented in Verilog-A uses the same convention for which signals map to which physical quantities (such as forward propagating power, phase, frequency, etc.). The use of different signal lines to represent forward and backward propagating signals artificially introduces the need for two different types of ports that can only be connected in certain configurations, similar to how "male" and "female" electrical connectors can only be connected to each other. This need for two port interface types is entirely artificial and is simply a byproduct of using the available standards in Verilog-A to simulate optical signals in photonic integrated circuits. Physically, optical waveguides can be connected to each other without any regard for a port type.

References [1], [2] and [3] (incorporated herein by reference) explain in detail the existing solutions for creating photonic compact models in Verilog-A, and all use different signal lines to represent forward and backward propagating signals. Example Verilog-A code is also readily available, in these references or elsewhere, that show precisely how Verilog-A can be used to create photonic compact models.

References [4] and [5] described a similar problem with Medium Dependent Interfaces (MDI) commonly used for ethernet communications and how it was solved through auto-configuration using Auto MDI-X.

These existing Verilog-A implementations make it possible to simulate photonic components with Verilog-A models. However, the need to represent forward and backward propagating signals on different signal lines creates two different port types that will be referred to herein as "left" and "right", similar to MDI and MDI-X.

In FIG. 1, a schematic view of an element is provided, and an example port interface standard used to connect to the signal buses. It can be seen that there are two port types: left and right.

In FIG. 2, two elements side by side are shown, that are meant to be connected by a bus, and it can be seen why two port types are required. Namely, if signal 0 is outgoing from one element then signal 0 is the incoming signal on the connected element. For any connection to be valid, ports may only be connected with their opposing port type. In FIG. 3, an example symbol representing an optical waveguide is shown, where the port types are specified as left and right.

The need for port types to be specified (i.e. left and right in this example) is problematic in a simulator because elements cannot be reversed. Unlike for MDI and MDI-X, this is not representative of physical reality. That is, the waveguide ports themselves do not physically have two types and can be connected arbitrarily with each other. Rather this is a consequence of trying to represent a physical waveguide as a multiline bus where different lines are used for forward and backward signals, creating a challenge that is distinct from those faced with interfaces like MDI/MDI-X.

It is an object of the following to address the above-noted challenge.

BRIEF DESCRIPTION OF THE DRAWINGS

Embodiments will now be described with reference to the appended drawings wherein.

DETAILED DESCRIPTION

Figure 1:
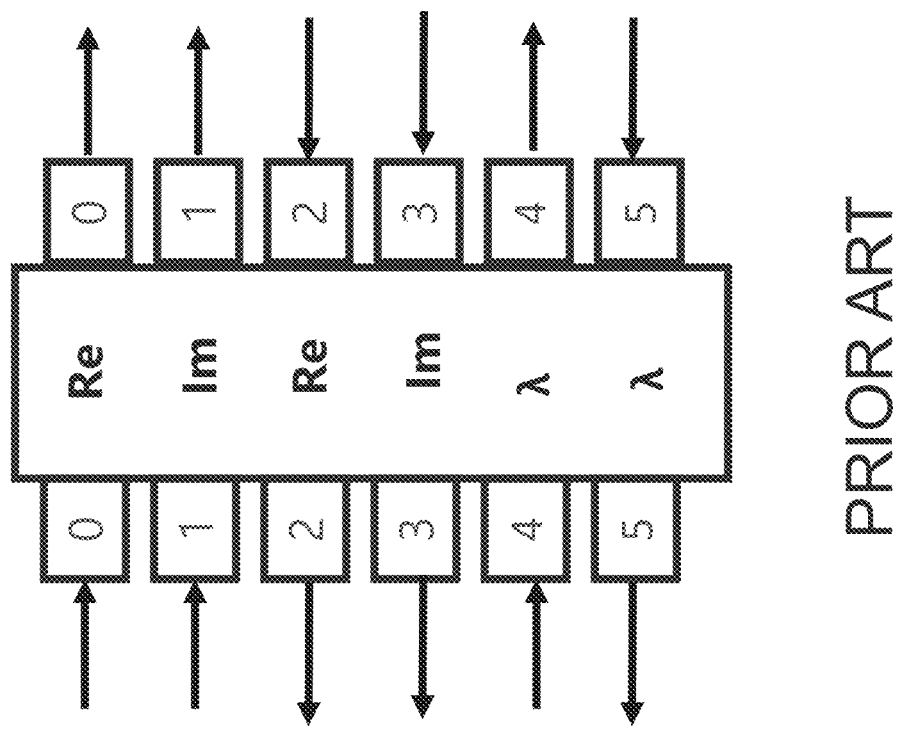
FIG. 1 is a schematic view of a prior art element with a typical Verilog-A compact model used in photonics.
Figure 2:
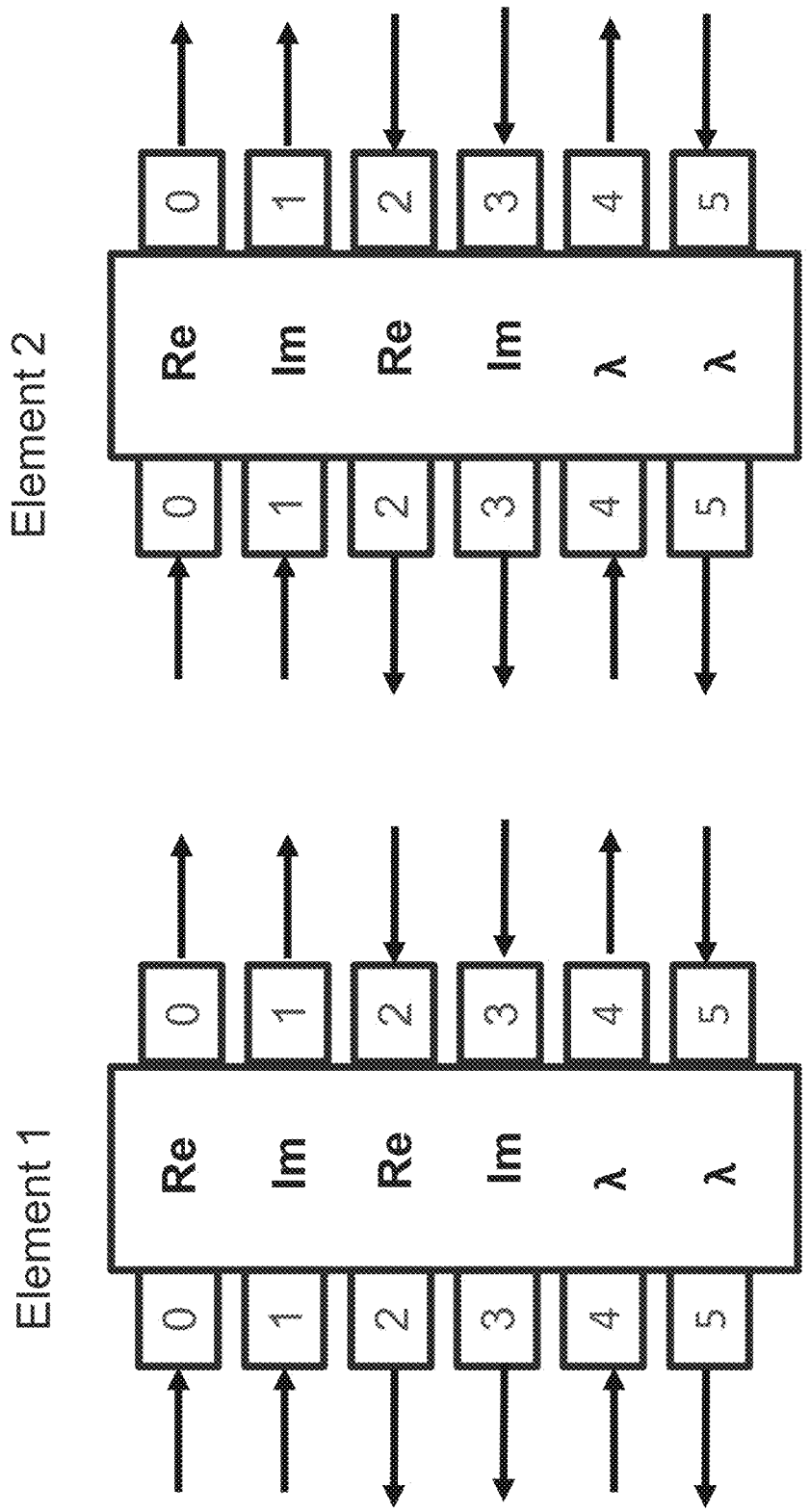
FIG. 2 is a schematic view of a pair of prior art elements with typical Verilog-A compact models that could be connected together to allow optical signals to flow therebetween.
Figure 3:
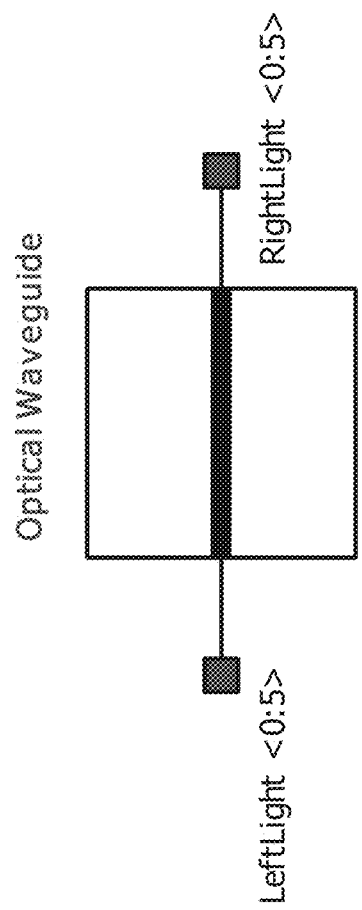
FIG. 3 is a view of a prior art symbol that can be used to represent a waveguide element with an underlying Verilog-A model.

The above-noted challenge is addressed by considering two solutions, each of which may be desirable for different implementations of Verilog-A models and disciplines, namely conservative, signal-flow or real-valued modeling. While these examples discuss solutions for simulators that support Verilog-A models (or their equivalent implemented in other languages such as C/C++), the solutions can be extended to other types of simulators, such as data flow simulators that do not already support bidirectional signals.

In one aspect, there is provided a method of simulating a circuit, comprising using potential and flow representations available in an electrical circuit simulator to create bidirectional signals on a single bus line.

In another aspect, there is provided a method of simulating a circuit using an electrical simulator, comprising autoconfiguring port types as one direction or another direction at runtime or during initialization to create bidirectional signals on a bus with a single port interface.

It has been recognized that if a designer accidentally connects the wrong port types it can cause the simulation to fail, and should ideally be forbidden. There are several possible solutions, each with shortcomings, as follows.

One possible solution could be to enforce that waveguides use only one port type (such as left) while all other elements use the other port type (such as right). This solves many simple use cases because elements are typically connected by waveguides, however, it would forbid the direct connection of any other elements such as waveguide bends or tapers which is very typically done. As a result, it would require introducing unnecessary waveguides between elements, or artificial, zero-length waveguides into the schematic that do not represent physical elements.

Another possible solution could be to create four different waveguide types for all combinations of port types. These waveguides could be used as "crossover" elements when necessary, similar to physical crossover cables used for connecting MDI to MDI. But this is not found to be desirable because it involves creating multiple different symbols to represent the same physical element, and furthermore, it still does not solve the problem of enabling the direct connection of other elements such as waveguide bends and tapers.

Another solution would be to create port conversion elements, but this is not found to be desirable because it involves introducing symbols into the circuit that do not physically exist. Since it is desirable to map the schematic to a physical layout, removing non-physical elements that are purely there for simulation purposes is considered to be problematic.

A further solution would be to create "crossover" connections similar to what is used when connecting two MDI interfaces (rather than an MDI to MDI-X). However, this would require substantial changes to existing simulators.

In each of these solutions, one would be introducing concepts into the schematic design and simulation environment that do not physically exist because the physical waveguide connections do not have two types. Furthermore, in each of these solutions the designer would be responsible for ensuring correct connections unless software changes to typical schematic editors and simulators were made to try and automate this.

It is therefore desirable to find a simple solution to create a single port interface that matches the physical reality of the waveguides without requiring changes to other software (such as schematic editors, schematic driven layout tools, and simulators that support Verilog-A) or existing standards for such software.

Two solutions to these challenges have been developed and implemented. As discussed in greater detail below, each solution may be desirable for different implementations of Verilog-A models and disciplines, namely conservative, signal-flow or real-valued modeling. While the below discusses the Verilog-A implementation of these solutions in detail, the principles discussed herein can also be applied to any comparable model implemented in a different software language, as well as existing simulators that do not support Verilog-A.

Figure 4:
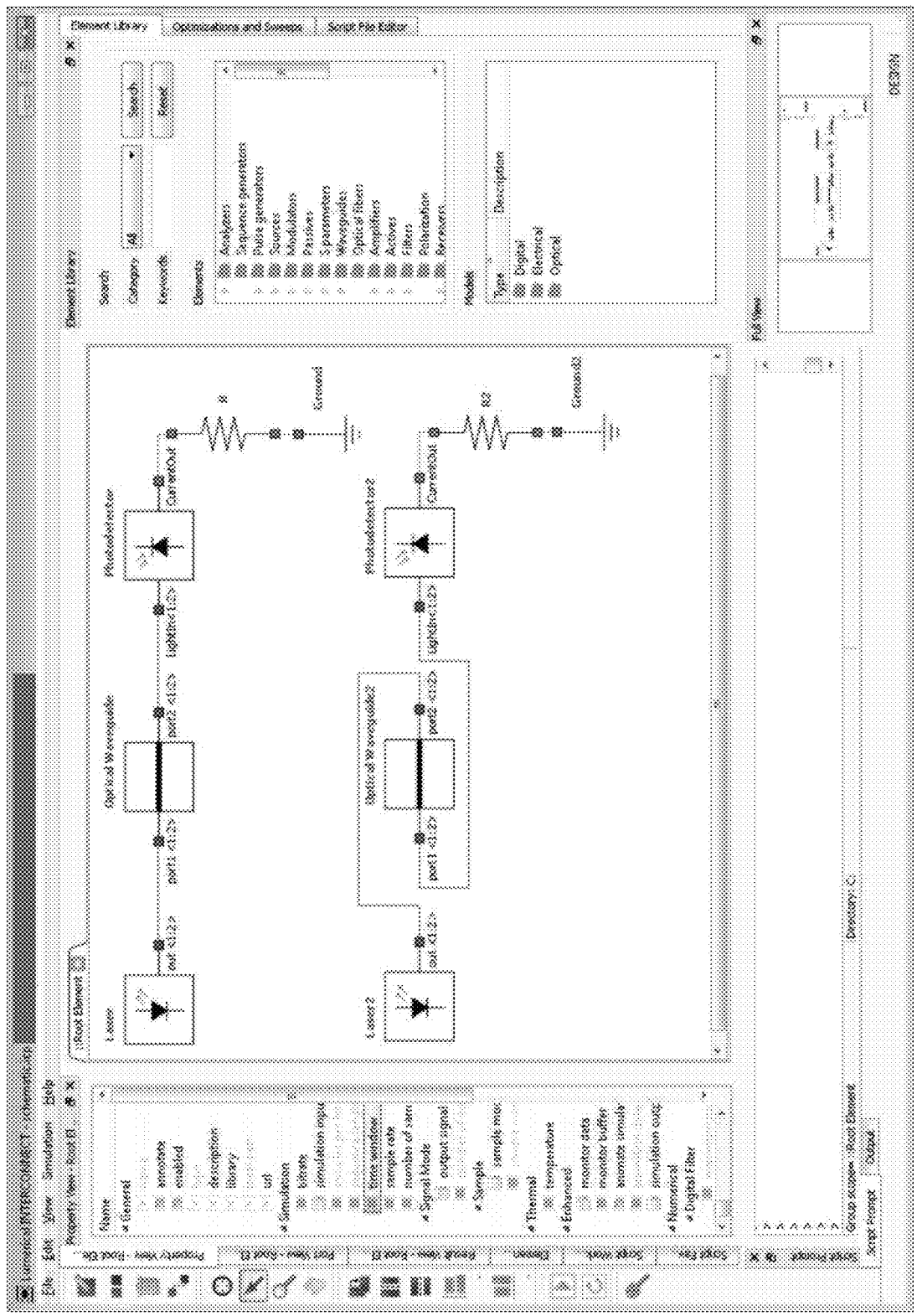
FIG. 4 is a screen shot of a graphical user interface for a simulation editor that can be used to implement the solutions provided herein.

FIG. 4 provides a screen shot of an example of a graphical user interface for a simulation editor. It can be appreciated that the schematic editor user interface can be used to draw a circuit schematic, which in this example can be saved to a "netist", i.e. a text file with a list of all of the components and connections between the ports. After the schematic is drawn, a simulator (i.e. separate software) is used to read the netist and simulate the circuit, thereafter saving the results to a file. The simulator is typically applied in non-graphical software, and thus typically does not have a user interface associated with it. The schematic editor may read the results files and display them as graphical information to the user. This can be automated, for example, such that a user can press a "run" button in the schematic user interface, and execute the above-noted steps in the background. It can be appreciated that users can combine different schematic editors with different simulation engines in order to create photonic circuits and conduct simulations. It can be appreciated that an advantage of the proposed solution(s) described herein is that the schematic editor does not need to deal with the aforementioned left/right port types. Instead, the complexity is handled by the Verilog-A (or equivalent) model of each element, so that even the simulation software does not require modification.

Solution 1: Create Bidirectional Signals on a Single Line

In this first solution, the above problems are addressed by using a single line to represent both forward and backward propagating signals, using existing capabilities.

It may be noted that Verilog-A uses the concept of potential and flow for analog ports (i.e. the conservative discipline). These are typically used for electrical signals so that Kirchhoff's voltage and current laws can be enforced. However, it is appreciated that this can be generalized to other applications whenever Kirchhoff's voltage and current laws can be generalized to potential and flow laws. For example, this is routinely done for thermal simulation where temperature is the potential and thermal power is the flow.

For optical signals, the proposed implementation can represent the electric field as the potential and the magnetic field as the flow, where the potential is measured with respect to a global reference of zero (0). While this is very natural from a physical point of view, it should be noted that the intention is to find a method to transmit forward and backward propagating signals on a single bus and therefore the physical meaning behind this representation is not required. For the implementation, one simply needs a potential and flow that will satisfy Kirchhoff's generalized potential and flow laws.

It is next recognized that a potential and flow on a transmission line can be represented as forward and backward propagating waves with a characteristic impedance. The characteristic impedance is a measure of the ratio of potential to flow for forward (or backward) propagating waves. When both forward and backward propagating waves are present, the ratio of potential to flow at any given location is not defined.

Figures 5A, 5B:
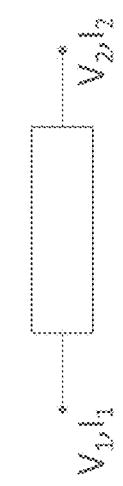
FIGS. 5(a) and 5(b) are a pair of physically identical descriptions of a two port device with a potential and flow that satisfies Kirchhoff's potential and flow laws.

FIGS. 5(a) and 5(b) show diagrams of how the same element with two ports can be represented by the potential and flow at each port (FIG. 5(a)), or by incoming and outgoing waves (FIG. 5(b)). The ratio between potential and flow is called the characteristic impedance of the transmission line, $R_0$. One can readily move between these two representations of potential and flow with the following transformation that is known for transmission line analysis:

$$a_i = \frac{1}{2}\left(\frac{V_i}{\sqrt{R_0}} + \sqrt{R_0}\, I_i\right)$$

$$b_i = \frac{1}{2}\left(\frac{V_i}{\sqrt{R_0}} - \sqrt{R_0}\, I_i\right)$$

$V_i$ and $I_i$ are, respectively, the potential and flow on port i. $a_i$ and $b_i$ are, respectively, the incoming and outgoing wave amplitudes on port i The normalization of a is chosen so that $a_i^2$ is the forward propagating power in the line when b is zero, and similarly for b.

Here, the solution uses the potential and flow signals as a mechanism to transmit information about forward and backward propagating optical signals. The choice of characteristic impedance is therefore arbitrary (as long as it is the same for all ports) and, for convenience, one can simply choose $R_0=1$.

Writing Verilog-A models for these bidirectional ports can now be readily implemented. In this implementation, one can first calculate the incoming signals ($a_i$) from the potentials and flows at all ports according to the above formulas. Then, one can calculate the outgoing signals ($b_i$) at all ports using established methods of writing photonic compact models. Next, one can calculate the new flow (or potential) at each port resulting from both the incoming and outgoing signal and define the flow (or potential) contributions to each port, in the usual way for Verilog-A.

As described above, the potential is measured with respect to a global reference of zero (0) (the global ground) and any net flow into and out of an element is assumed to flow to the global ground. Alternatively, explicit grounding of the optical signals can be used, or an additional ground line can be added to every optical bus (or even each bus line), to ensure that the net flow in the bus is always zero.

This solution requires the use of a conservative analog signal discipline that supports potential and flow.

Solution 2: Auto-Configuration of Port Type at Runtime

In this solution, the port type (left/right) is determined at runtime, either in an initialization phase or at the first time step. This is similar in concept to the Auto MDI-X technology referenced above but, again, is used to solve the simulation problem of using existing Verilog-A (or other electrical simulation) technology to simulate optical waveguides. Unlike Auto MDI-X, solution 2 is not attempting to solve a physical problem. All ports can be connected to each other.

This second solution can work because it is a well-established physical restriction that optical ports can only be connected to one other port (i.e., any splitting or forking of signals physically requires specialized elements such as y-branches or directional couplers). Therefore, there is always a one-to-one port partner pairing and all port pairs can be configured into either left or right at runtime. This solution can also work for non-conservative signal disciplines such as signal-flow or wreal as well as for data flow simulators.

Figure 6:
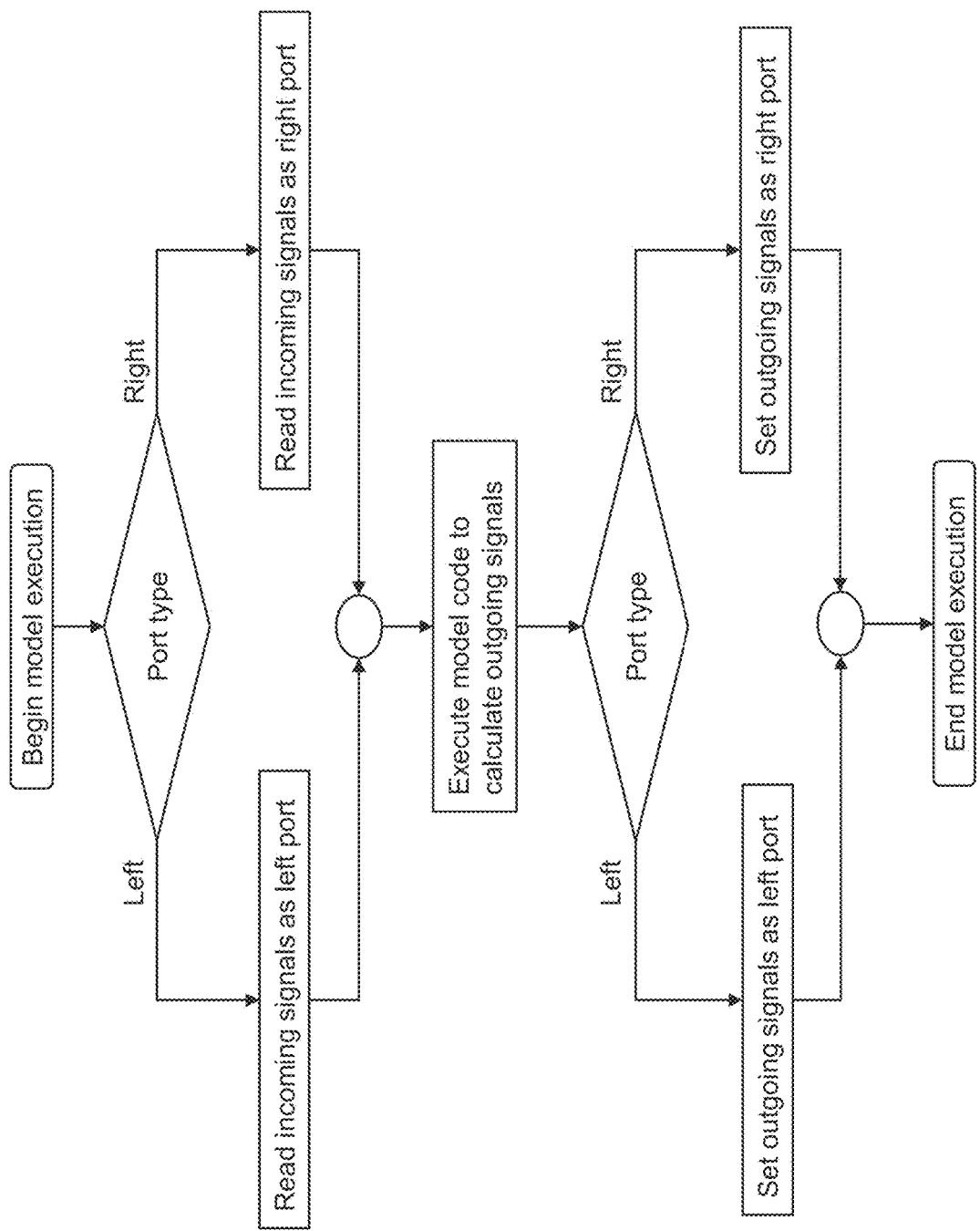
FIG. 6 is a flow diagram showing how a model code can be executed at each time step to make use of a port type flag, using software engineering principles, to efficiently handle either left or right handed ports with the same model code to convert incoming optical signals to outgoing optical signals.

When developing the photonic models, each port has an internal flag to determine if it is a left port or a right port. The port can then use this flag to support behaving either as a right port or as a left port. Well known software engineering concepts can be used to efficiently create Verilog-A (or similar) models with ports that can behave as either left or right ports depending on the value of this flag. FIG. 6 shows a flow diagram of the implementation of a model in code where the port type flag (left or right) is used to determine how incoming signals are read from the port and how outgoing signals are set (or pushed) to the port. FIG. 6 is shown for an element that has only one port, but it can be readily extended to an element with multiple ports which can be flagged as either left or right.

The value of the flag (left or right) must be determined at or immediately prior to runtime. This can be done in a pre-simulation preparation phase or during the simulation initialization (which may be a specific initialization allowed by the simulator or simply the first time step of the simulation). Once the port types are auto-configured, they would not change for the duration of the simulation.

Figure 7:
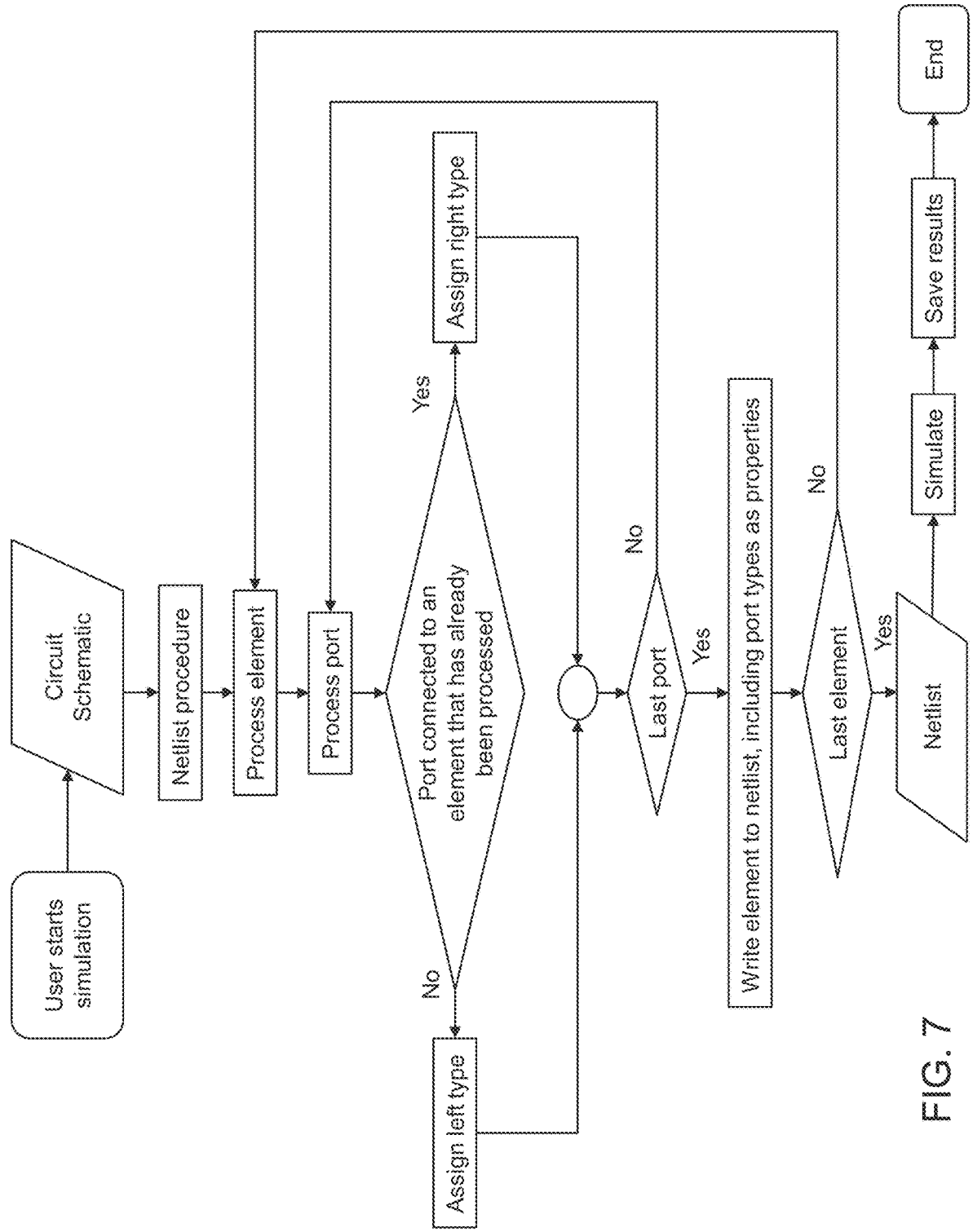
FIG. 7 is an example of a modified netlist procedure that could be used to autoconfigure all circuit ports to left or right type during a pre-simulation netisting phase.

As mentioned above, many schematic editing tools prepare a schematic for simulation by writing it to a netlist file which is then sent to the circuit simulator as an input. This is a procedure called "netisting" that defines all the elements, their non-default properties, and all the connections between their ports in a file. This is a fully automated procedure but many schematic editors allow it to be customized. This procedure can therefore be modified to automatically assign the port type flag as a property of each element, for each of its ports. It does not matter which port type is used as long as its connecting port has the opposite type. FIG. 7 shows an example flow diagram of how a netisting procedure could be used to assign left or right properties for each port of each element, as properties of the element written in the netlist. This description and diagram illustrate one example for netlisting but the concept can be applied to any automated simulation preparation, for example, it could be a similar approach for descending the schematic hierarchy from the top-level and assigning port types in an automated way when the user launches a simulation. We therefore refer to this solution as a "top-level" approach.

It is clear that other approaches could be used at an individual "model-level" to auto-configure the ports as long as each model can communicate with every other model to which it is connected in order to agree, on a port by port basis, which port type is being used. This could be accomplished at simulation initialization or the first time step.

The most suitable implementation (top-level or model-level) for auto-configuring ports, and the precise details of how that is accomplished, depends on the specific schematic editor and simulation tools used. Below demonstrates the auto-configuration solution through a top-level approach.

System Advantages

It can be appreciated that the proposed solutions eliminate the need for the simulation software, the schematic software, or the end-user of the models to have any knowledge of the left/right nature of ports. In one case, the present system does this by creating true, bidirectional signals. In the other case, the present system does this by auto-configuring the port type at, or immediately prior to, runtime (using existing schematic and simulation software technology) so the user does not have to be aware of which port type is used internally. In either case, there is a single port interface that can be used for all optical ports with, at most, an internal flag hidden to the end-user to indicate the current port configuration when the simulation runs.

While this auto-configuration solution is described for Verilog-A models and the simulators that support them, it clearly can be extended to other modeling languages, as well as other simulators.

Example Embodiment

Figure 8:
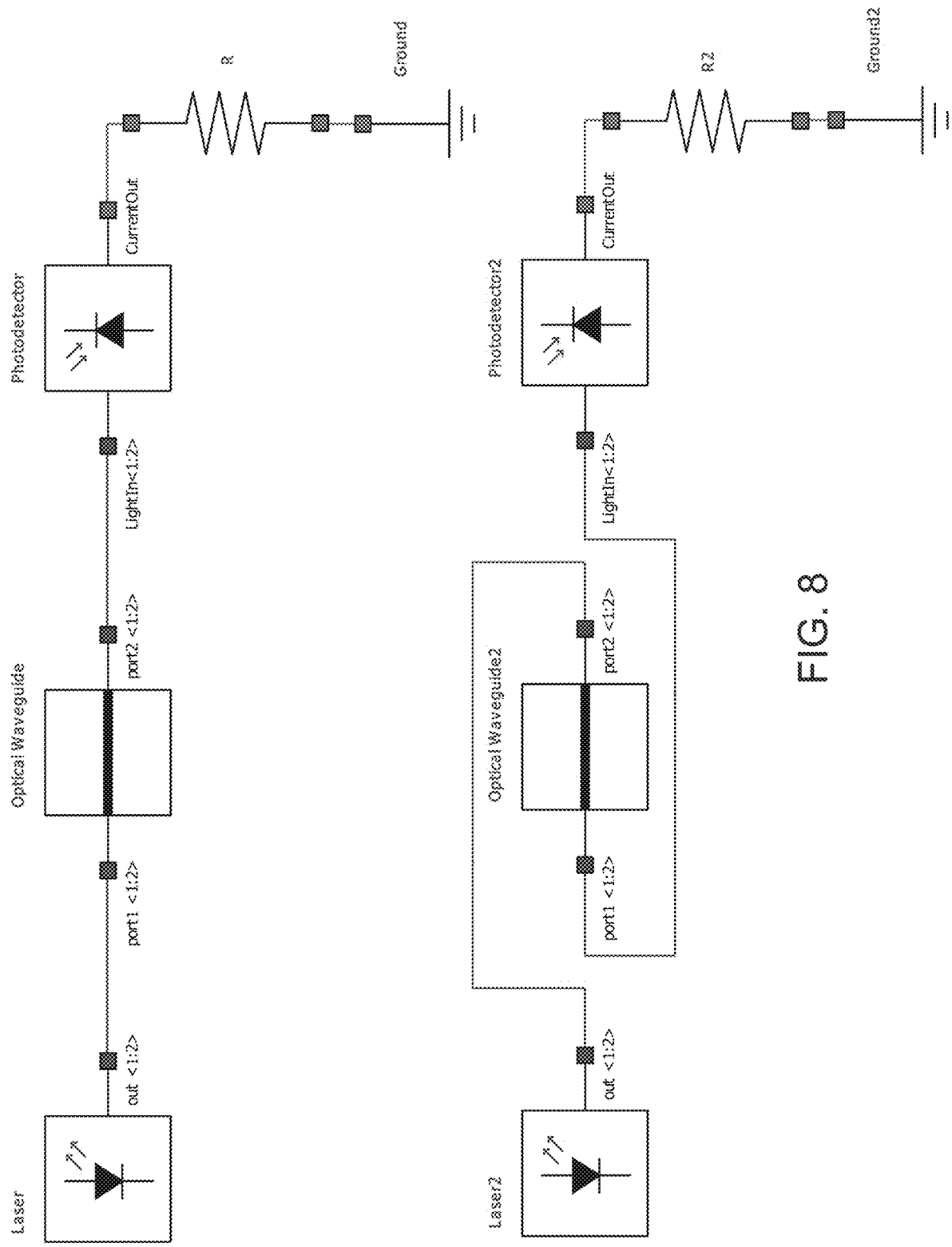
FIG. 8 is an example of a solution implemented, wherein in one configuration light propagates through a waveguide from port1 to port2, and in another configuration, light propagates through the waveguide from port2 to port1.

To illustrate the above principles, example embodiments will now be described, making reference to FIGS. 8 to 10. In a first embodiment, solution 1 is used to create bidirectional signals on each line, while in a second embodiment, solution 2 with autoconfiguration during the simulation initialization phase is used. In FIG. 8 two schematics of a photonic circuit are shown, which are created with the system described herein. It can be appreciated that in this example, the photonic circuit includes both pure optical elements and other elements, namely opto-electronic elements and pure electrical elements. In one schematic, the only difference is that the waveguide is reverse connected so that the light flows through it in the opposite direction (something that could not be done without the presently described system).

Figure 9:
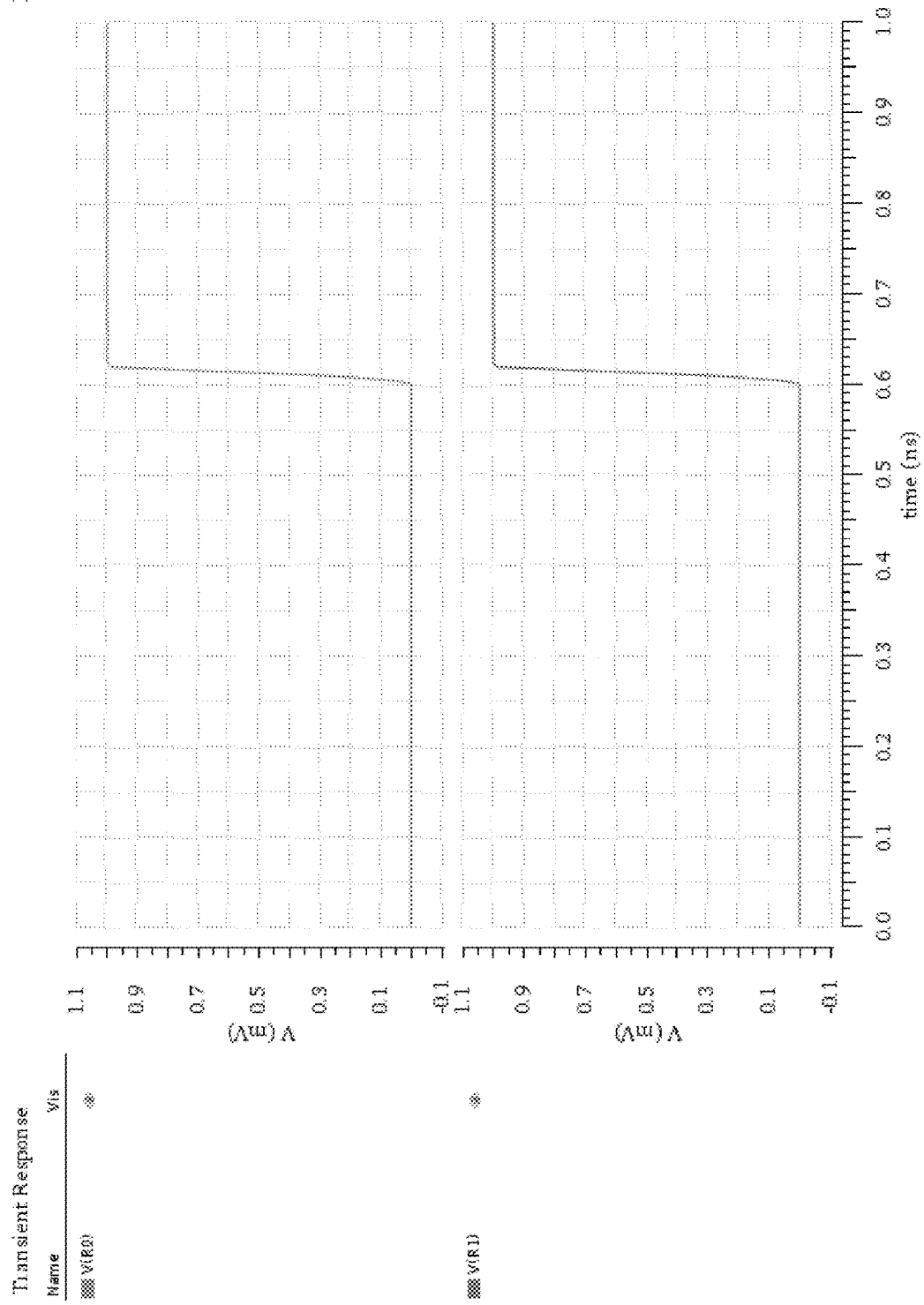
FIG. 9 is a chart illustrating simulation results of the two configurations shown in FIG. 8 showing identical results when implementing a first solution.

In FIG. 9, simulation results are shown for two configurations of FIG. 8, and it may be noted that the results are identical. In this example, the first solution was implemented, creating bidirectional signals on each bus line. These simulation results were created with a well-known commercial electrical simulator (Spectre Circuit Simulator), but other simulators that support Verilog-A could be used because the system described herein requires no modification to existing simulators.

Figure 10:
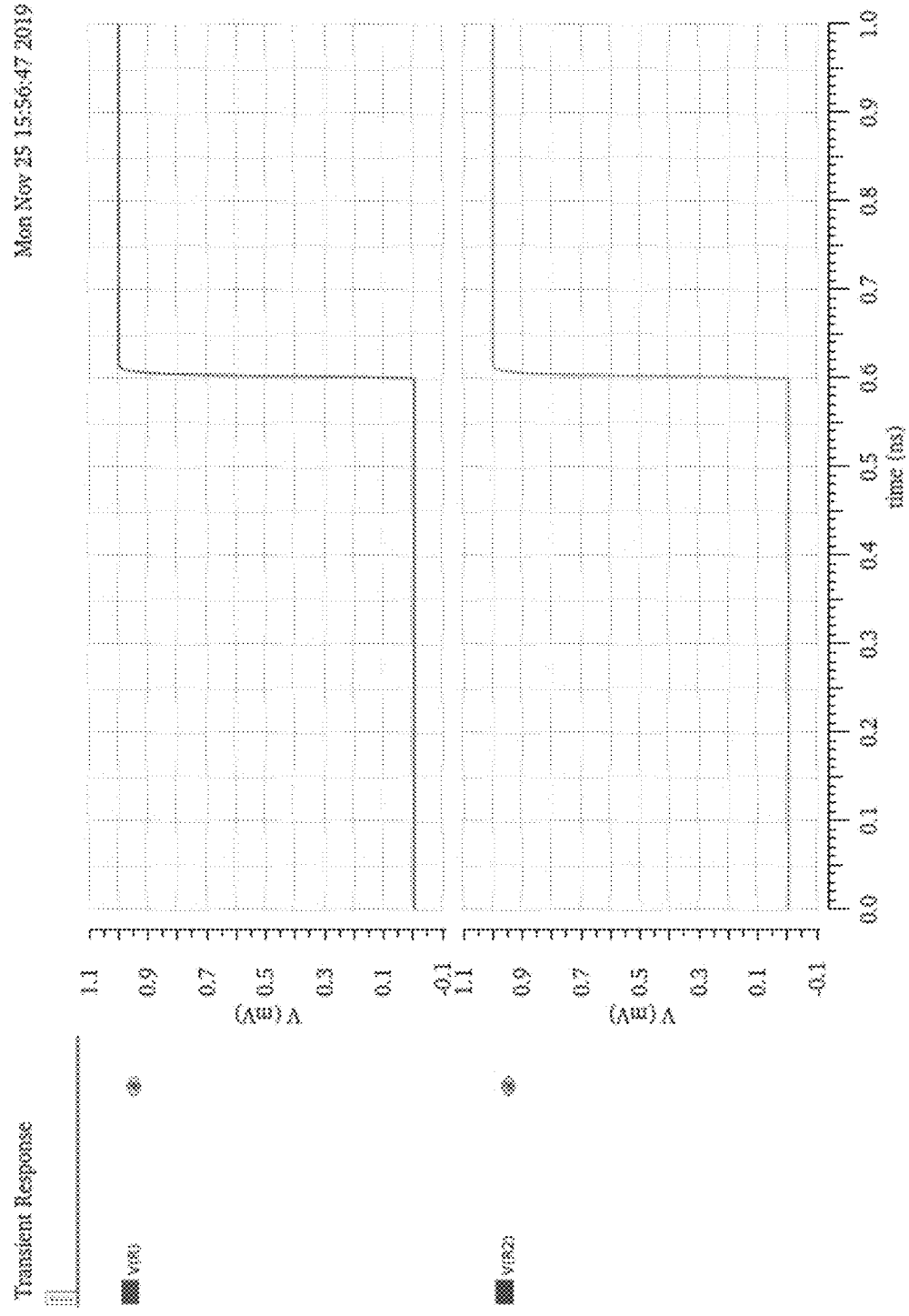
FIG. 10 is a chart illustrating simulation results of the two configurations shown in FIG. 8 showing identical results when implementing a second solution.

In FIG. 10, simulation results are again shown for two configurations of FIG. 8, and it may be noted that the results are also identical. In this example, the second solution was implemented using the top-level approach whereby the left or right port type is defined in a netlisting phase. The model then runs throughout the simulation using the flow described FIG. 6. These simulation results were also created with the Spectre Circuit Simulator, but other simulators that support Verilog-A could be used because the system described herein requires no modification to existing simulators.

Figure 11:
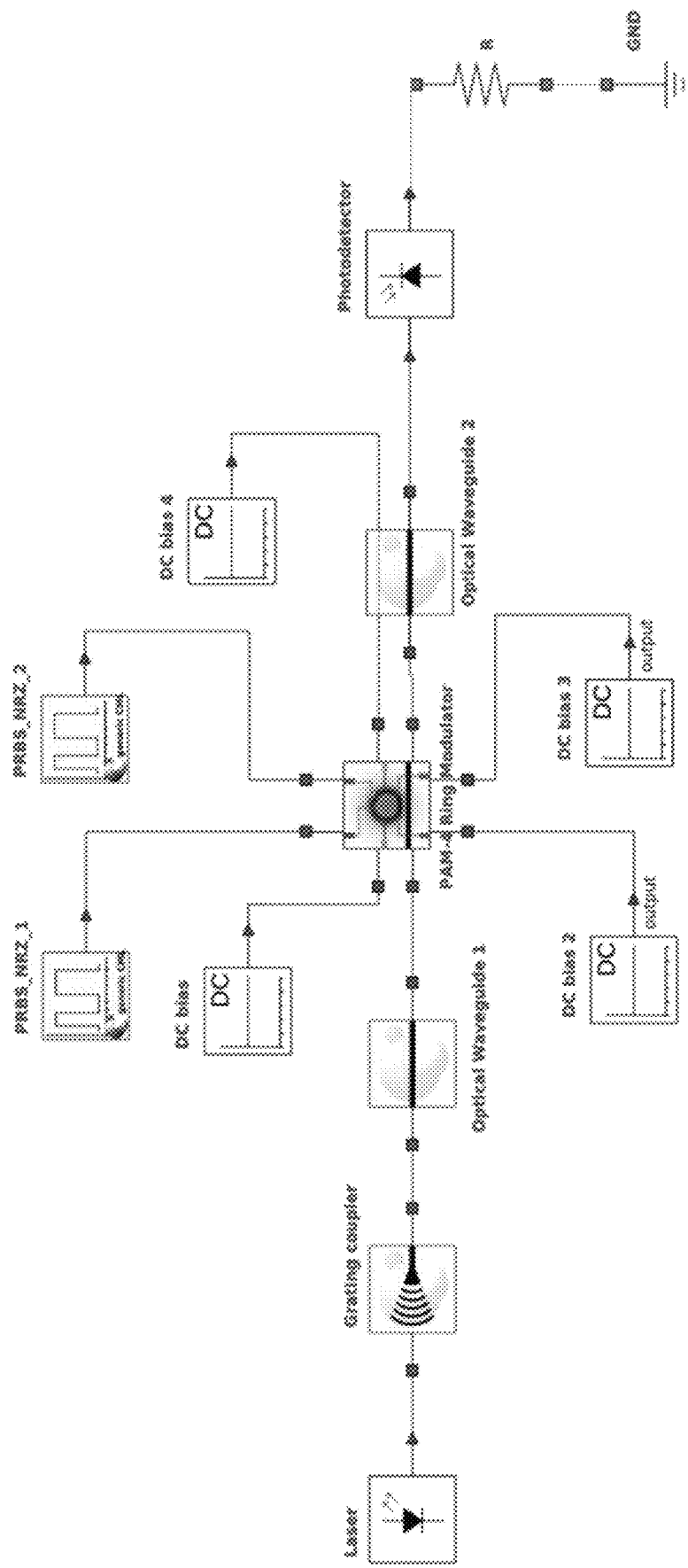
FIG. 11 is a circuit schematic of a pulse amplitude modulation four-level (PAM-4) circuit used for transceivers.
Figure 12:
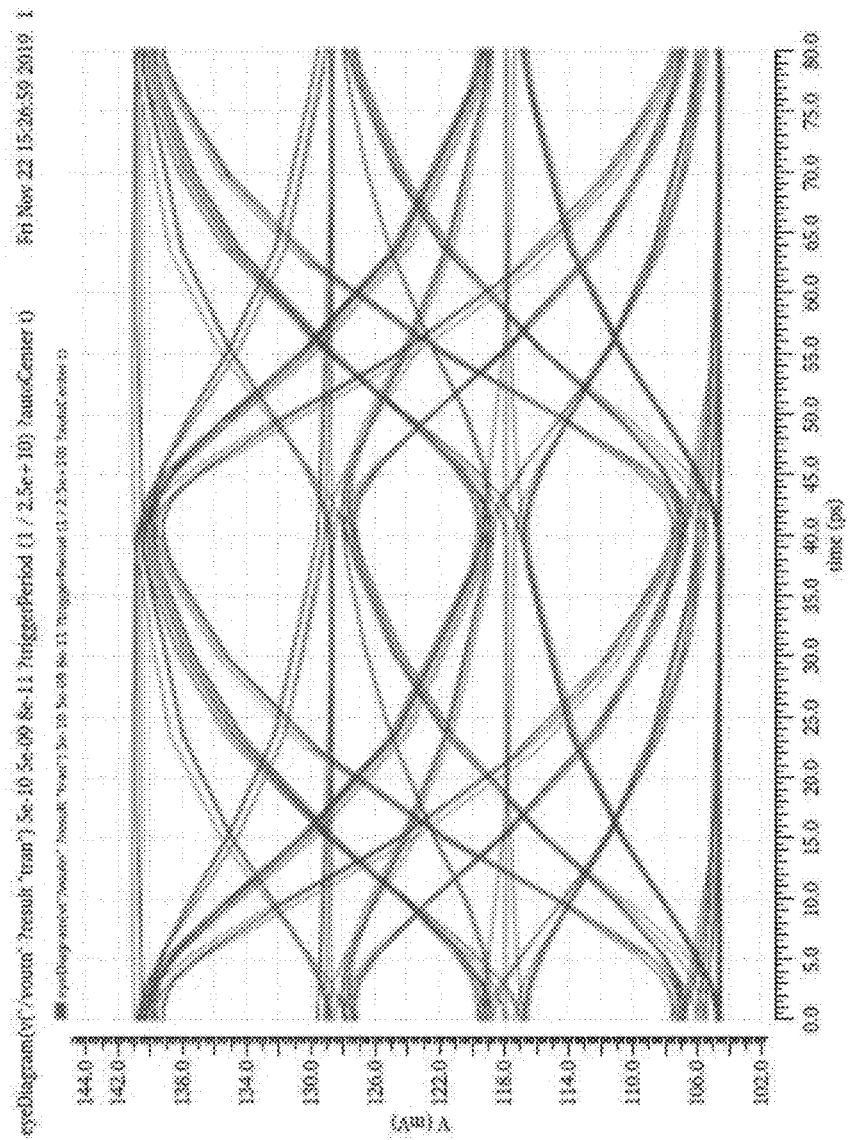
FIG. 12 shows the simulation results of the circuit shown in FIG. 11 when implementing a first solution showing the four-level eye diagram.

A more complex and typical embodiment example is show in FIGS. 11 and 12. FIG. 11 shows a circuit schematic of a pulse amplitude modulator with four levels (PAM-4) transceiver. FIG. 12 shows the 4-level eye diagram simulated using the Spectre Circuit Simulator where all photonic and electrical models were implemented in Verilog-A. In this example, the first solution was implemented, using bidirectional signals on each line.

For simplicity and clarity of illustration, where considered appropriate, reference numerals may be repeated among the figures to indicate corresponding or analogous elements. In addition, numerous specific details are set forth in order to provide a thorough understanding of the examples described herein. However, it will be understood by those of ordinary skill in the art that the examples described herein may be practiced without these specific details. In other instances, well-known methods, procedures and components have not been described in detail so as not to obscure the examples described herein. Also, the description is not to be considered as limiting the scope of the examples described herein.

It will be appreciated that the examples and corresponding diagrams used herein are for illustrative purposes only. Different configurations and terminology can be used without departing from the principles expressed herein. For instance, components and modules can be added, deleted, modified, or arranged with differing connections without departing from these principles.

It will also be appreciated that any module or component exemplified herein that executes instructions may include or otherwise have access to computer readable media such as storage media, computer storage media, or data storage devices (removable and/or non-removable) such as, for example, magnetic disks, optical disks, or tape. Computer storage media may include volatile and non-volatile, removable and non-removable media implemented in any method or technology for storage of information, such as computer readable instructions, data structures, program modules, or other data. Examples of computer storage media include RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by an application, module, or both. Any such computer storage media may be part of the system described herein, any component of or related to the system, etc., or accessible or connectable thereto. Any application or module herein described may be implemented using computer readable/executable instructions that may be stored or otherwise held by such computer readable media.

The steps or operations in the flow charts and diagrams described herein are just for example. There may be many variations to these steps or operations without departing from the principles discussed above. For instance, the steps may be performed in a differing order, or steps may be added, deleted, or modified.

Although the above principles have been described with reference to certain specific examples, various modifications thereof will be apparent to those skilled in the art as outlined in the appended claims.

REFERENCES

[1] P. Martin, F. Gays, E. Grellier, A. Myko and S. Menezo, "Modeling of silicon photonics devices with Verilog-A," 2014 29th International Conference on Microelectronics Proceedings-MIEL 2014, Belgrade, 2014, pp. 209-212.

[2] Cheryl Sorace-Agaskar, Jonathan Leu, Michael R. Watts, and Vladimir Stojanovic, "Electro-optical co-simulation for integrated CMOS photonic circuits with VerilogA," Opt. Express 23, 27180-27203 (2015).

[3] Ekaterina R., Modeling Photonic Links in Verilog-A, MIT thesis (2012).
[4] https://en.wikipedia.org/wiki/Medium-dependent_interface.
[5] http://www.hp.com/hpinfo/abouthp/iplicensing/automdix.html.

The invention claimed is:

1. A method of simulating optical signals transmitted via an optical connection, the method comprising:
   receiving a circuit model including an element to represent the optical connection, the element having at least one port for bidirectional optical signals via the optical connection; and
   simulating the circuit model for the bidirectional optical signals via the optical connection, wherein the at least one port has a potential and a flow, and wherein an incoming optical signal and an outgoing optical signal of the bidirectional optical signals are represented as separate combinations of the potential and the flow of the at least one port.

2. The method of claim 1, wherein the incoming optical signal and the outgoing optical signal correspond to separate combinations of the flow and the potential of the at least one port.

3. The method of claim 1, wherein the circuit model is represented in a modeling language.

4. The method of claim 1, wherein the potential and the flow are transmitted on the element to represent transmission of the bidirectional optical signals over buses connecting optical ports.

5. The method of claim 4, wherein the circuit comprises at least one photonic or pure optical element and at least one other type of element.

6. The method of claim 5, wherein the at least one other type of element comprises an electrical, thermal, or electro-optical element.

7. The method of claim 1, further comprising:
   calculating the incoming optical signal of the at least one port from the flow and the potential;
   calculating the outgoing optical signal of the at least one port based on a photonic compact model; and
   updating the flow and the potential of the at least one port based on the separate combinations for the incoming optical signal and the outgoing optical signal.

8. A non-transitory computer readable medium comprising computer executable instructions which, when executed by one or more processors, cause the processors to perform operations for simulating optical signals transmitted via an optical connection, the operations comprising instructions for:
   receiving a circuit model including an element to represent the optical connection, the element having at least one port for bidirectional optical signals via the optical connection; and
   simulating the circuit model for the bidirectional optical signals via the optical connection, wherein the at least one port has a potential and a flow, and wherein an incoming optical signal and an outgoing optical signal of the bidirectional optical signals are represented as separate combinations of the flow and the potential of the least one port.

9. The non-transitory computer readable medium of claim 8, wherein the outgoing optical signal is related to a weighted combination of the flow and the potential of the at least one port.

10. The non-transitory computer readable medium of claim 8, wherein the circuit model is represented in a modeling language.

11. The non-transitory computer readable medium of claim 8, wherein the potential and the flow are transmitted on the element to represent transmission of the bidirectional optical signals over buses connecting optical ports.

12. The non-transitory computer readable medium of claim 11, wherein the circuit comprises at least one photonic or pure optical element, and at least one other type of element.

13. The non-transitory computer readable medium of claim 12, wherein the at least one other type of element comprises an electrical, thermal, or electro-optical element.

14. The non-transitory computer readable medium of claim 8, further comprising instructions for:
   calculating the incoming optical signal of the at least one port from the flow and potential;
   calculating the outgoing optical signal of the at least one port based on a photonic compact model; and
   updating the flow and the potential of the at least one port based on the separate combinations for the incoming optical signal and the outgoing optical signal.

15. A system for simulating a circuit, the system comprising a processor and memory, the memory comprising computer executable instructions for simulating optical signals transmitted via an optical connection, comprising instructions for:
   receiving a circuit model including an element to represent the optical connection, the element having at least one port for bidirectional optical signals via the optical connection; and
   simulating the circuit model for the bidirectional optical signals via the optical connection, wherein the at least one port has a potential and a flow, and wherein an incoming optical signal and an outgoing optical signal of the bidirectional optical signals are represented as separate combinations of the potential and the flow of the at least one port.

16. The system of claim 15, wherein the incoming optical signal corresponds to a weighted combination of the potential and the flow.

17. The system of claim 15, wherein the circuit model is represented in a modeling language.

18. The system of claim 15, wherein the potential and the flow are transmitted on the element to represent transmission of the bidirectional optical signals over buses connecting optical ports.

19. The system of claim 18, wherein the circuit comprises at least one photonic or pure optical element, and at least one other type of element.

20. The system of claim 19, wherein the at least one other type of element comprises an electrical, thermal, or electro-optical element.

21. The system of claim 15, further comprising instructions for:
   calculating the incoming optical signal of the at least one port from the flow and the potential;
   calculating the outgoing optical signal of the at least one port based on a photonic compact model; and
   updating the flow and the potential of the at least one port based on the separate combinations for the incoming optical signal and the outgoing optical signal.

* * * * *